(12) United States Patent
Figueredo

(10) Patent No.: US 6,758,552 B1
(45) Date of Patent: *Jul. 6, 2004

(54) INTEGRATED THIN-FILM DRIVE HEAD FOR THERMAL INK-JET PRINTER

(75) Inventor: Domingo A. Figueredo, Albany, OR (US)

(73) Assignee: Hewlett-Packard Development Company, Houston, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 111 days.

(21) Appl. No.: 08/568,209

(22) Filed: Dec. 6, 1995

(51) Int. Cl.⁷ ................................................ B41J 2/05
(52) U.S. Cl. ........................................ 347/59; 347/59
(58) Field of Search ............................... 347/58, 59, 57, 347/53; 346/57, 56, 54, 20; 257/379, 350, 359

(56) References Cited

U.S. PATENT DOCUMENTS

| | | | |
|---|---|---|---|
| 3,852,563 A | | 12/1974 | Bohorquez et al. |
| 3,973,106 A | | 8/1976 | Ura |
| 4,288,829 A | * | 9/1981 | Tango ..................... 257/359 |
| 4,429,321 A | * | 1/1984 | Matsumoto ................ 347/59 |
| 4,490,728 A | | 12/1984 | Vaught et al. |
| 4,513,298 A | | 4/1985 | Scheu |
| 4,514,741 A | | 4/1985 | Meyer |
| 4,528,574 A | | 7/1985 | Boyden |
| 4,535,343 A | | 8/1985 | Wright et al. |
| 4,616,408 A | | 10/1986 | Lloyd |
| 4,695,853 A | | 9/1987 | Hackleman et al. |
| 4,716,423 A | | 12/1987 | Chan et al. |
| 4,719,477 A | | 1/1988 | Hess |
| 4,725,859 A | | 2/1988 | Shibata et al. |
| 4,809,428 A | | 3/1989 | Aden et al. |
| 4,847,630 A | | 7/1989 | Bhaskar et al. |
| 4,862,197 A | | 8/1989 | Stoffel |
| 4,922,265 A | | 5/1990 | Pan |
| 4,927,505 A | | 5/1990 | Sharma et al. |
| 4,931,813 A | | 6/1990 | Pan et al. |
| 4,965,611 A | | 10/1990 | Pan et al. |
| 5,008,689 A | | 4/1991 | Pan et al. |
| 5,010,355 A | | 4/1991 | Hawkins et al. |
| 5,081,473 A | * | 1/1992 | Hawkins et al. .............. 347/59 |
| 5,122,812 A | | 6/1992 | Hess et al. |
| 5,159,353 A | | 10/1992 | Fasen et al. |
| 5,229,785 A | | 7/1993 | Leban |
| 5,420,627 A | | 5/1995 | Keefe et al. |

FOREIGN PATENT DOCUMENTS

| | | | | |
|---|---|---|---|---|
| EP | 378439 | * | 7/1990 | ................ 347/50 |
| EP | 0434946 A3 | | 11/1990 | ............. B41J/2/16 |
| EP | 0525787 A3 | | 7/1992 | ............. B41J/2/16 |
| FR | 2 110 322 | | 6/1972 | ............. B41J/3/00 |
| JP | 58153672 | | 9/1983 | ............. B41J/3/20 |
| JP | 62204964 | | 9/1987 | ............. B41J/3/20 |
| JP | 62242552 | | 10/1987 | ............. B41J/3/20 |
| JP | 4110161 | | 4/1992 | ............ B41J/2/335 |

OTHER PUBLICATIONS

"The Third–Generation HP Thermal InkJet Printhead", by: J. Stephen Aden, Jaime H. Bohorquez, Douglas M. Collins, M. Douglas Crook, Andre Garcia, and Ulrich E. Hess; Feb. 1994; Hewlett–Packard Journal.

"The Third–Generation HP Thermal InkJet Printhead," ADEN, S. et al; Feb. 1994 Hewlett–Packard Journal; pp. 41–45.

* cited by examiner

*Primary Examiner*—John Barlow
*Assistant Examiner*—Michael Brooke

(57) ABSTRACT

A thin-film ink-jet drive head provides a MOSTFT (metal oxide semiconductor thin-film transistor) transistor, a resistor and the interconnect between the two electrical components, all comprised of the same, multi-functional thin-film layer. Differing portions of the multi-functional thin-film layer function as (1) heating resistors to propel ink droplets from the printhead (2) ink MOSTFT transistors to selectively drive (fire) the resistors, and (3) direct conductive pathways between the drive transistors and the resistors.

19 Claims, 1 Drawing Sheet

INTEGRATED THIN-FILM DRIVE HEAD FOR THERMAL INK-JET PRINTER

TECHNICAL FIELD

This invention relates generally to an integrated thin-film drive head for thermal ink-jet printing and more particularly, to a drive head wherein the driver transistor, the resistor and the interconnect are comprised of the same thin-film layer.

BACKGROUND AND SUMMARY OF THE INVENTION

An ink-jet printer includes a pen in which small droplets of ink are formed and ejected toward a printing medium. Such pens include printheads with orifice plates having very small nozzles through which the ink droplets are ejected. Adjacent to the nozzles inside the printhead are ink chambers, where ink is stored prior to ejection. Ink is delivered to the ink chambers through ink channels that are in fluid communication with an ink supply. The ink supply may be, for example, contained in a reservoir part of the pen.

Ejection of an ink droplet through a nozzle may be accomplished by quickly heating a volume of ink within the adjacent ink chamber. The rapid expansion of ink vapor forces a portion of the ink in the chamber through the nozzle in the form of a droplet. This process is called "firing." The ink in the chamber is heated with a heat transducer that is aligned adjacent to the nozzle. Typically, the heat transducer is a resistor, or piezoelectric transducer, but may comprise any substance or device capable of quickly heating the ink. Such printers are known as thermal ink-jet printers.

Thin-film resistors are typically used in drive heads of thermal ink-jet printers. In such a device, a resistive heating material is typically disposed on an electrically and thermally insulated substrate. Conventional fabrication techniques allow placement of a substantial number of resistors on a single drive head substrate.

In the past, the number of resistors applied to the substrate was limited by the conductive components used to electrically connect the drive head to external pulse driver circuitry for selectively heating the resistors. Thus, thermal ink-jet drive heads have been developed which incorporate pulse driver circuitry directly on the drive head substrate with the resistors. The incorporation of the pulse driver circuitry on the drive head substrate reduces the number of interconnect components needed to electrically connect the pen to the printer, thereby allowing fabrication of smaller ink-jet pens.

The pulse driver circuitry located on the substrate, typically comprises MOSFET drive transistors (metal oxide semiconductor field effect transistors). The integrated circuitry (i.e., resistors, drive transistors and interconnects) are dimensionally defined on the substrate by conductive trace patterns, lithographically formed using conventional masking, ultraviolet exposure and etching techniques known in the art.

The pulse driver circuitry (hereafter referred to as a driver head) is affixed adjacent to an ink barrier and an outer orifice plate. The internal geometry of the ink barrier defines the shape of the ink chamber. The ink chamber is situated above, and aligned with, a corresponding resistor which, when fired (heated), ejects a droplet through the chamber nozzle.

The integration of driver components and heater resistors on the same drive head substrate requires multi-layer connective circuitry so that the driver transistors can communicate with the resistors and other portions of the printing system. Typically, this circuitry involves a plurality of separate material layers, each formed using conventional circuit fabrication techniques.

Fabrication of conventional ink-jet drive heads generally requires at least four metal depositions and nine lithographic masks (excluding an ink barrier mask) to define the above-described driver circuit components. This procedure results in high production costs and relatively low manufacturing efficiency.

The amount of energy necessary for ejection of ink droplets from the chamber is known in the art as "turn on energy" or TOE. A higher TOE may result in excessive printhead heating. Excessive printhead heating generates bubbles from air dissolved in the ink and causes the ink vapor bubble for form prematurely. Air bubbles within the ink and premature formation of the vapor droplet result in a poor ink droplet formation and, thus, poor print quality. Print speed must be slowed to a rate that prevents excessive printhead heating.

Ink-jet drive head systems that can operate at higher temperatures than the operating temperatures of conventional (aluminum-based) drive heads, without electrical or thermal degradation, improve drive head reliability. Allowing operation at higher temperatures increases print speed without sacrificing print quality.

Current thermal ink-jet drive head devices use aluminum as one of the basic components for the formation of the resistors in the drive head integrated circuitry. Although aluminum resistors are acceptable for most applications, they suffer from two major drawbacks: (1) electromigration, or physical movement, of the aluminum in the driver head, which may cause failure at relatively high current densities and (2) relatively complex fabrication processes, as mentioned above.

The present invention provides integrated, thin-film driver heads for a thermal ink-jet printhead, the fabrication of which eliminates the above described disadvantages of conventional drive head devices. The present invention provides smaller resistors that require a low TOE. Smaller drive head circuitry also allows fabrication of smaller printhead, which in turn allows printers to run at faster print speeds with excellent print quality, while minimizing printhead heating.

The present invention also provides an improved drive head manufacturing process, resulting in faster, more cost effective fabrication, producing thin-film ink-jet drive heads superior in both operation and reliability.

According to the present invention, a preferred thin-film ink-jet drive head provides a MOSTFT (metal oxide semiconductor thin-film transistor) transistor, a resistor and the interconnect between the two electrical components, all comprised of the same, multi-functional thin-film layer. Thus, differing portions of the multi-functional thin-film layer of the present invention functions as (1) heating resistors to propel ink droplets from the printhead (2) ink MOSTFT transistors to selectively drive (fire) the resistors, and (3) direct conductive pathways between the drive transistors and the resistors. The present invention substantially eliminates the need to use numerous thin-film layers for carrying out these functions.

The preferred manufacturing process of the present invention requires only five lithographic masks and two metal depositions. The time and materials efficiency of the present drive head fabrication process makes it significantly more economical than previous processes. Moreover, the process of the present invention results in smaller printheads with the advantages described above.

Additionally, when the multi-functional thin-film layer comprises polysilicon or a similar material, the transistor gate and resistor dimensions can be made even smaller, resulting in printheads with very low TOEs. As discussed above, a lower TOE allows faster print speed with improved print quality. A smaller resistor will also allow ejection of smaller ink bubbles. A smaller ink bubble increases resolution.

DESCRIPTION OF PREFERRED EMBODIMENTS

Figure 1:
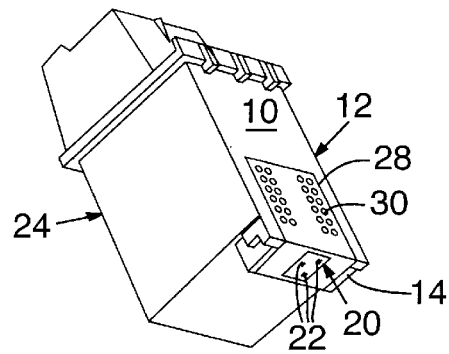
FIG. 1 is a perspective view of an ink-jet printer pen that includes a printhead incorporating a preferred embodiment of the thin-film drive head of the present invention.

Referring to FIG. 1, the driver head of the present invention is incorporated within an ink-jet pen 10. The preferred pen 10 includes a pen body 12 defining a reservoir 24. The reservoir 24 is configured to hold a quantity of ink. A printhead 20 is fit into the bottom 14 of the pen body 12 and controlled for ejecting ink droplets from the reservoir 24. The printhead defines a set of nozzles 22 for expelling ink, in a controlled pattern, during printing. Each nozzle 22 is in fluid communication with a firing chamber 16 (FIG. 2c) defined in the of printhead 20.

The pen includes an ink supply within the pen reservoir 24. A supply conduit (not shown) conducts ink from the reservoir 24 to ink channels (not shown) defined in the printhead 20. The ink channels are configured so that ink moving therethrough is in fluid communication with each firing chamber 16 and hence each nozzle 22.

Conductive drive lines to the printhead are carried upon a circuit 28 mounted to the exterior of the pen body 12. Circuit contact pads 30 (shown enlarged for illustration in FIG. 1), at the ends of the drive lines engage similar pads carried on a matching circuit attached to the printer carriage (not shown).

Figure 2A:
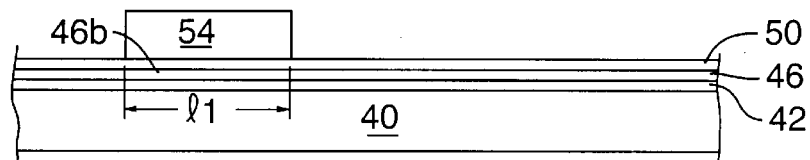
FIGS. 2a–e are partial, cross-sectional diagrams depicting fabrication of a preferred embodiment of the driver head.
Figure 2B:
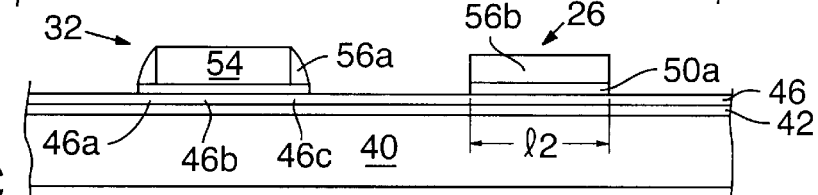
Figure 2C:
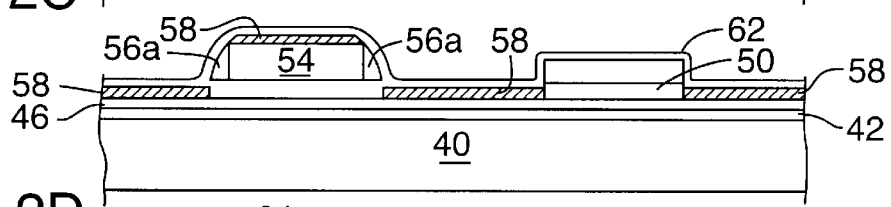
Figure 2D:
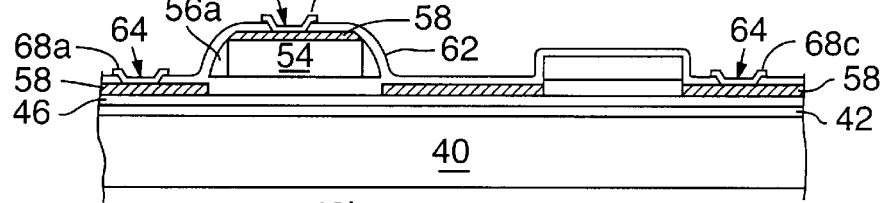
Figure 2E:
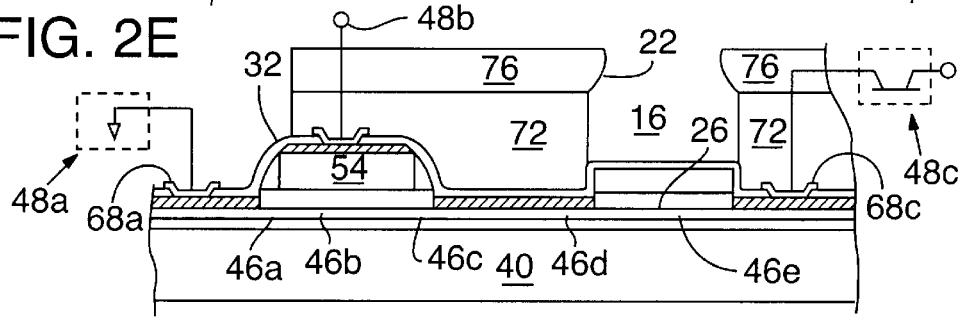

FIG. 2e depicts a partial cross-sectional view of the drive head. Each firing chamber 16 has associated with it a thin-film resistor 26. The resistors 26 are selectively driven (heated) by pulse driver circuitry preferably comprising MOSTFT-type drive transistors 32. Preferably, the transistor 32 comprises a MOSTFT silicon-gate transistor which includes a source diffusion 46a, a gate 54, a channel 46b and a drain diffusion 46c, all of which define electrical contact regions to which various components (e.g. resistors) and electrical circuitry may be connected.

Each resistor 26 is in electrical communication with a driver transistor 32 through an interconnect (also referred to as a "circuit conduction line") 46d. The transistor 32 selectively drives the resistor 26 with sufficient current to instantly vaporize some of the ink in the chamber 16, thereby forcing a droplet through the nozzle 22.

The resistor 26 also electrically communicates, through the conductive drive lines, with a conventional source of drain voltage which is located externally, in the printer unit as schematically illustrated at 48c in FIG. 2e.

The transistor source diffusion 46a is connected through the conductive drive lines to an external ground 48a. Additionally, an external lead 48b is connected to gate 54 through the conductive drive line.

The signal for firing the resistors 26 is generated by a microprocessor and associated drivers that apply signals through the drive lines to the transistors. The transistor 32 acts as an electrical "switching" device, sending the firing signals through interconnect 46d to the resistors 26.

Referring generally to FIG. 2e, in a preferred embodiment of the present invention, the thin-film device comprises at least one MOSTFT drive transistor 32, at least one resistor 26, a first interconnect 46d between the drive transistor and resistor, a second interconnect 68a–c between the internal circuitry (i.e., transistor 32, resistor 26 and interconnect 46d) of printhead 20 and external driver circuitry of the pen 10. The thin-film drive head device is adjacent to an ink barrier 72 and an orifice plate 76.

The following discussion first concerns fabrication of a preferred embodiment of the thin-film drive head device, and then turns to its method of operation.

FIG. 2a illustrates a substrate 40 which, in a preferred embodiment, comprises a conventional IC silicon wafer. Alternatively, the substrate 40 may comprise any sufficiently rigid, heat resistant material capable of having a dielectric material adhere to its surface.

In a preferred embodiment, a relatively thick insulation layer 42 (also referred to as a dielectric) is deposited on substrate 40 (FIG. 2a). A preferred insulation layer 42 comprises silicon dioxide, thermally grown on substrate 40 by techniques known in the art. Other materials may serve as insulation layer 42 such as, for example, sputter deposited silicon mono- or di-oxides, borophosphate silicate glass or PECVD (plasma enhanced chemical vapor deposition) silicon nitride. Insulation layer 42 is preferably about 1.7 μm in thickness.

Insulation layer 42 serves as both a thermal and electrical insulator to the circuit that will be built on its surface.

A multi-functional thin-film layer 46, preferably comprising polysilicon deposited by LPCVD (low pressure chemical vapor deposition), is deposited uniformally over insulation layer 42. The multi-functional layer 46 may also comprise silicon carbide deposited by PECVD. The thickness of multi-functional layer 46 is, preferably, about 0.3 μm. It is notable that insulation layer 42 may be omitted and multi-functional thin-film layer 46 may be deposited directly on certain substrate materials which possess dielectric and heat transfer characteristics suitable for directly receiving the desired material.

Regions of the multi-functional layer 46 function as (1) components of the MOSTFT transistors 32, which selectively drive the resistors 26, (2) heating resistors 26 and (3) interconnects, direct conductive pathways between the drive transistors and the resistors.

Following deposition of multi-functional layer 46, the layer is uniformly doped along its entire depth to increase its conductivity (i.e., reduce the layer's resistivity). Regions (also referred to as portions) of the doped multi-functional layer 46 eventually serve as the transistor channel 46b, the heater resistor portion 46e and circuit conduction line 46d. For portion 46e of multi-functional layer 46 to serve as the heater resistor 26, layer 46 will be doped a second time, as described below.

In a preferred embodiment, multi-functional layer 46 is doped with arsenic or phosphorous by ion implantation techniques well known in the art. Layer 46 may also be doped using thermal diffusion techniques with classical chemical dopants such as, for example, phosphorous oxychloride, boron trichloride or boron tribromide. Multi-functional layer 46 is preferably doped by ion implantation at a level of about $4 \times 10^{12}$ atoms/cm$^2$ to about $20 \times 10^{12}$ atoms/cm$^2$.

A gate oxide layer 50 is then deposited uniformly over multi-functional layer 46, preferably, at a thickness of about 500 Å (FIG. 2a). Gate oxide layer 50 preferably comprises thermally grown silicon dioxide. RTA (rapid thermal anneal, also known as RTP, rapid thermal processing or RTO, rapid thermal oxidation in an oxygen atmosphere) could also be used to deposit gate oxide layer 50. RTA is a preferred deposition method for very thin gate oxide layers such as, for example, less than 100 Angstroms. A thinner gate oxide layer 50 provides a faster device with a lower threshold voltage as compared with aluminum based MOS gates used in conventional driver heads.

If ion implantation techniques are utilized to dope multi-functional layer 46, the wafer must later be annealed. However, thermal deposition of gate oxide layer 50 may perform the dual function of annealing the wafer and depositing the gate oxide layer, if carried out at an elevated temperature of about 1000 C. It is notable that annealing causes both horizontal and vertical diffusion of the dopant. Thus, preferred dopants are those that do not diffuse significantly at such elevated temperatures. If thermal diffusion is utilized for doping multi-functional layer 46, no annealing step is necessary and hence, non-thermal gate oxide deposition processes known in the art, may be used.

A thin-film layer 54 is then deposited, patterned and etched to define the transistor gate (FIG. 2a depicted as "l1". Preferably the gate 54 comprises polysilicon deposited by LPCVD at a thickness of about 0.4 m. Gate 54 is etched using conventional dry etch techniques such as, for example, plasma etching, RIE (reactive ion etch), or ion milling, using etchants such as, chlorine or carbon tetrachloride. However, any etchant which selectively removes the undesired portions of gate layer 54 and not multi-functional layer 46, is sufficient. Preferred dimensions of gate 54 are in length ("l1" in FIG. 2a) and 10 m in width measured perpendicular to the plane of FIG. 2.

Patterning and etching of gate 54 allows the portion of gate layer 54 remaining (after patterning etching) to be doped a second time. Gate layer 54, thus, protects the portion 46b of multi-functional layer 46 beneath the gate (also referred to as the channel or active portion of the transistor), from being doped during the second doping procedure.

The second dopant is selectively added to all portions of multi-functional layer 46 and gate 54, with the exception of multi-functional layer portion 46b, to increase the conductivity of those portions. The portion of multi-functional layer 46b beneath gate 54 is the only portion of multi-functional layer 46 which is not doped during this process. The second doping step is a high dosage, high energy dopant preferably comprising arsenic or boron applied by ion implantation. A preferred second dopant dose level is about $3 \times 10^{14}$ atoms/$cm^2$ to about $1 \times 10^{15}$ atoms/$cm^2$.

The second dopant increases the conductivity in those portions of multi-functional layer 46 which will act as the transistor source diffusion 46a, the transistor drain diffusion 46c, the interconnect 46d, and the active portion 46e of resistor 26. The second dopant level may be used to adjust the final resistivity, sheet resistance and thermal coefficient of resistance of resistor 26. The second dopant dosage may also be adjusted to reduce undesirable resistances of portions of multi-functional layer 46, a portion of which will serve as a conductive pathway or interconnect 46d between the transistor 32 and the resistor 26.

Additionally, the doping of gate 54 allows the gate to function as a transistor electrode. The dopant does not, however, penetrate gate 54 to the channel portion 46b of the multi-functional layer therebelow. By doping just the active portion 46e of the resistor 26, without doping the channel portion 46b of the transistor, the conductivity value of resistor 26 may be adjusted independent of the final electrical properties of the transistor 32 through this second doping process. Independent doping of the resistor 26 allows for decoupled engineering of each of the devices.

A conformal thin-film layer (shown as 56a and 56b in FIG. 2b), preferably comprising PECVD TEOS (tetraethyloxysilane), is deposited uniformally over the exposed portions of gate oxide layer 50 and gate 54. Conformal layer 56 is preferably about 500–1000 Angstroms in thickness.

The conformal layer is then patterned over the "resistor portion" of conformal layer 56b. Portion 56a of the conformal layer is etched to define spacers 56a, on either side of gate 54. Patterning and etching of the conformal layer 56b additionally defines the length "l2" of resistor 26 (FIG. 2b). The portions of gate oxide layer 50 below the etched portions of the conformal layer are etched at the same time the conformal layer is etched. Thus, two portions of gate oxide layer remain (i.e., the portion under the gate 54 and spacers 56a and the portion beneath the patterned portion of conformal layer 56b) (FIG. 2b).

The conformal thin-film layer is preferably anisotropically dry etched using, for example, an RIE fluorinated etchant known in the art. Trifluoromethane ($CHF_3$) is a preferred etchant as its etchant process slows when in contact with a silicon material. Thus, there is a selective dry etch of the conformal layer and the resulting exposed portions of gate oxide layer 50.

Portion 56b of the conformal layer, in addition to defining the resistor 26 length, functions to protect the resistor 26. Spacers 56a on either end of the gate 54 protect the side walls of gate 54 from the silicide, as described below.

The thickness of the thermally conductive portion 56b directly affects the amount of thermal energy transferred from the resistor 26 to ink within the firing chamber 16 when the resistor is fired. Thus, a thinner-conformal layer will result in a lower TOE for the printhead. The advantages of a lower printhead TOE are discussed above.

It is noteworthy that the thicknesses of both gate oxide layer 50 and resistor conformal layer 56b may be adjusted, by techniques known in the art, to emulate prior art aluminum-based resistors such that, drive heads fabricated according to the present invention may be retrofitted to prior art ink-jet printers.

A thin-film conductive layer 58, preferably a refractory metal, is deposited atop the exposed portions of multi-functional layer 46 and gate layer 54. Conductive layer 58, when comprising a refractory metal, reacts with the underlying multi-functional layer and with polysilicon gate 54 to form a silicide. Metal deposition over a MOS device is known in the art as salicide (or self-aligned silicide). A refractory metal layer, also known as silicide layer 58, will not form on top of oxide spacers 56a or the oxide-based portion 56b. Thus, only the portions of multi-functional layer 46 that will serve as the conductive pathways or as interconnect 46d from the transistors 32 to the resistors 26 and the gate 54 are salicided. It is important that the silicide does not form on spacers 56a, as this connection would electrically short out the gate 54 and source diffusion and drain diffusion areas.

Refractory metal layer 58 is preferably comprised of titanium or tungsten, formed by sputtering techniques known in the art. However, layer 58 may comprise any metal capable of forming a metallic compound with silicon.

Refractory metal layer 58 causes portions of the interconnect 46d and gate 54 to possess a relatively high conductivity level, (i.e., low resistance level). Additionally, the silicide layer reduces undesirable sheet resistance of the portion of multi-functional layer functioning as interconnect 46d. The silicide formed on top of gate 54 also provides a low contact resistance with gate 54 and reduces the overall sheet resistance of transistor 32 as compared to conventional aluminum-based drive head devices. However, the resistor portion 46e of multi-functional layer 46 remains at a high resistivity level as this portion is not salicided.

A passivation layer 62 is next deposited to cover the drive head device (FIG. 2c). Passivation layer 62 preferably comprises LPCVD silicon nitride, silicon carbide or silicon oxynitride. The passivation layer 62 protects the resistor 26 and other components from the corrosive action of the ink used within ink-jet pens. This protection is especially important with respect to the resistors since any physical damage thereto can impair operational capabilities of the drive head.

A cavitation barrier (not shown) may be deposited over the passivation layer. A cavitation barrier, which covers the passivation layer and resistor, eliminates or minimizes mechanical damage to insulation layer 42, resistor 26, and passivation 62 caused by the momentum of the unexpelled ink collapsing back into the ink chamber. In a preferred embodiment, the cavitation barrier comprises tantalum, although other materials such as, for example, tungsten or molybdenum may be used.

Due to the smaller size of the printhead with the fabrication process of the present invention, smaller volumes of ink can be heated and smaller ink droplets can be fired from the printhead. Heating smaller ink volumes results in a smaller volume of unexpelled ink collapsing back into the ink chamber. With smaller volumes of ink collapsing back into the chamber, there is a reduction in the amount of physical damage to ink chamber 16 and underlying layers. Thus, passivation layer 62 may be sufficient to serve as both a protective layer from the corrosive ink and a cavitation barrier.

Passivation layer 62 is then patterned and etched to define vias 64 for the second interconnect 68a–c (FIG. 2d). Layer 62 is patterned and etched using conventional deposition and dry etch processes, as discussed above. In a preferred embodiment of the present invention, second interconnect 68a–c comprises metals such as, for example, titanium trinitride/aluminum or titanium tungsten gold.

Second interconnect 68a–c is preferable deposited using well known sputtering techniques. Although two sputterings may be used, only a single sputter chamber pump-down is necessary. Second interconnect layer 68a–c is then patterned and etched. Second interconnect 68a–c connects the internal drive head circuitry (transistor 32 and resistor 26) to the external driver circuitry.

More specifically, resistor 26, in addition to electrically communicating with transistor 32, electrically communicates through interconnect 68c with a conventional source 48c of drain voltage located externally in the printer unit as schematically illustrated in FIG. 2e.

Additionally, the source diffusion 46a of transistor 32 is connected to an external ground 48a through interconnect 68a. Finally, an external lead 48b is connected to gate 54 of transistor 32 through the interconnect 68b.

As illustrated in FIG. 2d, at this point the transistor 32, resistor 26 and interconnect circuitry are complete and the subsequent process steps concern completion of the firing chamber 16.

The ink barrier 72 of the firing chamber 16 preferably comprises a photosensitive polymer (FIG. 2e). This polymer defines the walls of the firing chamber 16 and determines the spacing between the resistor 26 and the nozzle 22.

A section of ink barrier 72 directly above the resistor 26 is removed (or the ink-jet barrier is selectively applied) in a conventional manner during the manufacturing process, in order to form firing chamber 16 (FIG. 2e). Firing chamber 16 receives ink from ink reservoir 24 through connecting channels or conduits. An orifice plate 76 is bonded to the top of the ink barrier 72 (FIG. 2e). Orifice plate 76 controls the droplet shape and direction and is preferably manufactured of nickel. The orifice plate 76 includes a plurality of nozzles 22, each nozzle corresponding to at least one of the resistors in the system. Specifically, orifice plate 76 includes an opening which is directly above and aligned with resistor 26 of the thin-film device.

In another preferred embodiment of the present invention, the conformal thin-film layer (56a and 56b) is applied, patterned and etched prior to the second doping procedure. Doping after conformal layer 56a, 56b is applied allows spacers 56a to shield the portion of gate oxide layer 50 underlying spacers 56a from being doped too heavily during the second doping process. A highly doped gate oxide region immediately under the spacer may cause low source diffusion 46a to drain diffusion 46c breakdown voltage in the transistor component 32.

The conformal layer 56a, 56b serves three functions. First, when patterned, the portion 56b of the conformal layer defines the length of the resistor. Second, the portions 56a of the conformal layer form the spacers which protect the source diffusion 46a and drain diffusion 46c regions of the gate oxide layer 50 from the silicide process which follows next. Lastly, the conformal layer protects the source diffusion 46a and drain diffusion 46c regions from being heavily doped, as described immediately above.

Operation of a preferred embodiment of the present invention is as follows. As described above, the printhead 20 device of the present invention has three basic electrical components, a transistor 32, a resistor 26 and an interconnect 46d between the two. The electrical components are utilized to selectively fire droplets from the chambers 16 through the printhead nozzles 22.

The transistor 32 receives electrical voltage through a lead 48b from a source located external to the printhead 20. The transistor acts as a current switch, selectively allowing current to flow through interconnect 46d and to resistor 26, in order to fire a droplet from the chamber 16. Current travels from the source diffusion region 46a, through the gate 54 and into the drain diffusion 46c. When a voltage is applied to the gate 54, a field effect takes place in the surface of multi-functional layer portion 46b or channel underlying the gate.

No current can flow between the source diffusion 46a and drain diffusion 46c until the gate 54 becomes conductive. The gate becomes conductive when sufficient voltage is applied to it such that a conducting channel 46b is formed beneath the gate 54. Such a sufficient current level is known as the threshold voltage. Thus, the transistor 32 acts as a switch, as current will only flow from the transistor 32 when the threshold voltage is reached and a channel 46b is formed.

The threshold voltage level of the device depends on the dopant concentration of the multi-functional layer 46. The first dopant process creates the required dopant concentration in the gate region 54. The second doping process dopes the source diffusion 46a and drain diffusion 46c at levels heavier than the gate region 54, which sets the threshold voltage required to switch the transistor 32 "on" and thus conduct current to the resistor 26.

The conductor or silicide layer 58 on top of gate 54 makes the gate more conductive (i.e., reduces overall sheet resistance of the gate) which in turn reduces the power necessary to run the transistor 32.

Resistor 26, doped at a high level through the two doping processes, acts as a heat transducer, converting the electrical signal selectively sent by the transistor 32 via the drain diffusion 46c and through interconnect 46d to heat energy which heats the ink in the firing chamber 16.

Although the operation of the transistor 32 of the above-described embodiment is discussed in terms of a "normally-off" or enhancement MOSTFT, it is understood that the transistor component may also operate as a "normally-on" or depletion MOSTFT. That is, conducting channel 46b exists at a zero bias (i.e., when no voltage is being applied to the gate) then the transistor component 32 is normally-on. Thus, a constant bias or voltage is applied to the gate of a depletion MOSTFT, except when the resistor is to be fired. When the voltage to the gate is turned off, the transistor component is "on," and current is conducted to the resistor thereby, firing an ink droplet.

Having described and illustrated the principles of the invention with reference to preferred embodiments, it should be apparent that the invention can be further modified in arrangement and detail without departing from such principles.

What is claimed is:

1. A drive head for a thermal ink-jet printhead device comprising:
    a transistor;
    a heat transducer; and
    a multi-functional layer having a first portion that functions as a channel of the transistor and having a second portion that functions as a portion of the heat transducer.

2. The drive head of claim 1 including an ink chamber assembly attached thereto, the ink chamber assembly including an ink barrier and a plate member positioned above the ink barrier, the plate member having an opening for ejecting an ink droplet therethrough.

3. The drive head of claim 2 further including a conformal layer defining a length of the heat transducer, and which conformal layer protects a portion of the heat transducer.

4. The drive head of claim 3 wherein the plate member opening is positioned above the second portion of the multi-functional layer.

5. The drive head of claim 1 wherein a third portion of the multi-functional layer is more conductive than the second portion of the multi-functional layer.

6. The drive head of claim 1 wherein the third portion of the multi-functional layer functions as a conductive pathway between the transistor and the heat transducer.

7. The drive head of claim 6 wherein the first portion of the multi-functional layer includes a region that is doped at a level significantly lower than the second portion.

8. The drive head of claim 6 including a conductive layer positioned above the center region of the first portion and above the third portion such that the center region of the first portion and the third portion are more conductive than the second portion.

9. The drive head of claim 1 wherein the heat transducer is a resistor.

10. The drive head of claim 1, further comprising a gate layer above a center region of the first portion of the multi-functional layer, wherein the gate layer.

11. The drive head of claim 1 wherein the second portion is doped at a level such that the second portion functions as the heat transducer.

12. A drive head for a thermal ink-jet printhead device comprising:
    a substrate;
    a transistor attached to the substrate;
    a resistor attached to the substrate; and
    an uninterrupted layer of conductive material interconnected between and forming at least a part of the transistor and the resistor and
    wherein preselected portions of the uninterrupted layer of conductive material are doped at different levels such that a first portion of the layer functions as a channel of the transistor and a second portion functions as part of the resistor.

13. The drive head of claim 12 including an ink chamber assembly, the ink chamber assembly comprising an ink barrier positioned above the uninterrupted layer of conductive material and a plate member positioned above the ink barrier, the plate member having at least one opening positioned above the resistor for ejecting a droplet therethrough.

14. The drive head of claim 12 wherein the uninterrupted layer of conductive material includes a third portion that functions as a conductive pathway between the first portion and the second portion.

15. The drive head of claim 14 including a conductive layer positioned above a center region of the first portion and above the third portion.

16. A method for fabricating a drive head for a thermal ink-jet printhead device comprising the steps of:
    providing a substrate;
    attaching to the substrate a transistor and a resistor; and
    inter-connecting the transistor with an uninterrupted layer of conductive material so that a first portion of the layer functions as a channel of the transistor and a second portion of the layer functions as the resistor.

17. The method of claim 16 wherein the uninterrupted layer is inter-connected to the transistor and to the resistor so that a third portion of the uninterrupted layer is integral with the transistor and the resistor and functions as an inter-connection therebetween.

18. The method of claim 16 including the step of selectively doping portions of the uninterrupted layer of conductive material.

19. The method of claim 18 including the step of forming a conductive layer positioned to contact the gate layer and a portion of the exposed second portion of the multi-functional layer.

* * * * *

UNITED STATES PATENT AND TRADEMARK OFFICE
CERTIFICATE OF CORRECTION

PATENT NO. : 6,758,552 B1
DATED : July 6, 2004
INVENTOR(S) : Domingo A. Figueredo It is certified that error appears in the above-identified patent and that said Letters Patent is hereby corrected as shown below:

Column 3,
Line 28, after "the", delete "of";

Column 10,
Line 8, after"wherein the gate layer" insert -- functions as a transistor gate electrode --

Signed and Sealed this

Seventh Day of September, 2004

JON W. DUDAS
*Director of the United States Patent and Trademark Office*